(12) United States Patent
Muratov et al.

(10) Patent No.: US 7,116,239 B2
(45) Date of Patent: Oct. 3, 2006

(54) CURRENT SENSE COMPONENTS FAILURE DETECTION IN A MULTI-PHASE POWER SYSTEM

(75) Inventors: Vladimir Alexander Muratov, Manchester, NH (US); Stefan Woldzimierz Wiktor, Raleigh, NC (US)

(73) Assignee: Texas Instruments Incorporated, Dallas, TX (US)

( * ) Notice: Subject to any disclaimer, the term of this patent is extended or adjusted under 35 U.S.C. 154(b) by 653 days.

(21) Appl. No.: 10/403,311

(22) Filed: Mar. 31, 2003

(65) Prior Publication Data

US 2004/0189315 A1 Sep. 30, 2004

(51) Int. Cl.
*G08B 21/00* (2006.01)
(52) U.S. Cl. .................. 340/635; 340/650; 340/661; 340/664; 323/285; 324/500; 361/63; 361/88
(58) Field of Classification Search ............... 340/635, 340/664, 649, 650, 651, 661; 324/96, 110, 324/520, 500; 323/70, 271, 282–285; 361/88, 361/93.9, 62–64; 363/65, 98, 132
See application file for complete search history.

(56) References Cited

U.S. PATENT DOCUMENTS

| 5,614,889 | A | * | 3/1997 | Kim | 340/649 |
| 6,031,749 | A | * | 2/2000 | Covington et al. | 363/98 |
| 6,147,848 | A | * | 11/2000 | Boggs et al. | 361/93.2 |
| 6,684,134 | B1 | * | 1/2004 | Sieleman | 700/292 |
| 6,841,979 | B1 | * | 1/2005 | Berson et al. | 323/282 |

* cited by examiner

*Primary Examiner*—Davetta W. Goins
(74) *Attorney, Agent, or Firm*—W. James Brady, III; Frederick J. Telecky, Jr.

(57) ABSTRACT

An evaluator (210) having an input (207) for receiving a signal indicative of a channel current sensed via a sensor in a mutlichannel current sharing system, and circuitry (313, 319) coupled to the input (207) and responsive to the signal for indicating an unreliable sensing for the sensor when a low current condition occurs for a time period exceeding the switching time period of the channel current. Further, the apparatus can include an additional input (207) and circuitry (313, 319) for evaluating an additional sensor sensing an additional channel current. The low current condition is characterized by thresholds corresponding to the peak level and a valley level of the channel current over a switching time period.

20 Claims, 3 Drawing Sheets

CURRENT SENSE COMPONENTS FAILURE DETECTION IN A MULTI-PHASE POWER SYSTEM

FIELD OF THE INVENTION

The invention relates generally to integrated circuits and, more particularly, to current sensing evaluation in a multiphase power system.

BACKGROUND OF THE INVENTION

Multiphase DC/DC converters have gained a significant market share in high current low output voltage applications. Conventional converters include an integrated pulse width modulation (PWM) controller, power MOSFETs and an output filter, such as that shown in the FIG. 1, in which power conversion is performed by a plurality of power channels working in parallel. An output filter typically includes inductors (L) and capacitors (C). The MOSFETs control current in the output inductors in which a high-side switch selectively couples the inductor to a positive power supply while a low-side switch selectively couples the inductor to ground. The PWM controller controls the high-side and low-side switches. An important function of the PWM controller is to assure equal sharing between the plurality of channels and provide protection functions to the MOSFETs. Conventional current sharing functions include sensing channel current (typically via sensor circuitry such as the resistors shown in FIG. 1), comparing channel currents to the average system current, and adjusting control signals of the PWM controller in accordance with the results. The sensed channel current information can also be used to monitor the state of a load.

Components of the current sensing circuitry, are typically not integrated with the PWM controller and thus are susceptible to damage or variations from manufacturing, testing, and operation. For example, current sense resistors or printed wires can be damaged during the processes of placing, soldering, washing, and handling at manufacturing, or burned out due to a severe overload. In any of these cases the channel current information (typically produced in the form of a representative signal) obtained from the current sense resistor will not be a true representation or is not produced at all, falsely indicating a zero current.

Conventional current share schemes will respond to such a false zero current indication by steering more current to that channel creating a severe overload for the components within this channel. An example of a behavioral pattern of a four-channel system with a failure in the second channel current sense path is illustrated in the graph shown in FIG. 1A. As shown in the graph, most of the load current, approximately 60A, has been steered into the second channel. Eventually, the overall system will encounter catastrophic damage as a single channel of a multiphase system is typically designed to carry a load that is only 1/n of the system load. Therefore, a need exist for a effective approach for detecting sensing component irregularity or failure for improving overall system reliability and robustness and/or increasing manufacturing yields.

SUMMARY

The present invention achieves technical advantages as an apparatus, system and method for detecting current sensor component irregularity or failure in multiphase converters in which the channel currents alternate between a peak level and a valley level over a switching time period. The apparatus and system include an input for receiving a signal indicative of a current sensed via a sensor, and circuitry coupled to the input and responsive to the input signal for indicating an unreliable sensing when a low current condition occurs for a time period corresponding to the switching time period. The apparatus and system can further include an additional input and circuitry for evaluating an additional sensor sensing an additional channel current. The method includes providing a signal indicative of a current sensed by the current sensor and comparing the signal to a predetermined threshold for detecting a low condition for providing a low condition signal upon detecting a low condition transition. Further the low condition signal is compared to a predetermined time period for providing a fail signal upon detecting the low condition signal having a duration greater than the predetermined time period.

BRIEF DESCRIPTION OF THE DRAWINGS

For a more complete understanding of the present invention, reference is made to the following detailed description taken in conjunction with the accompanying drawings wherein.

DETAILED DESCRIPTION

Figure 1:
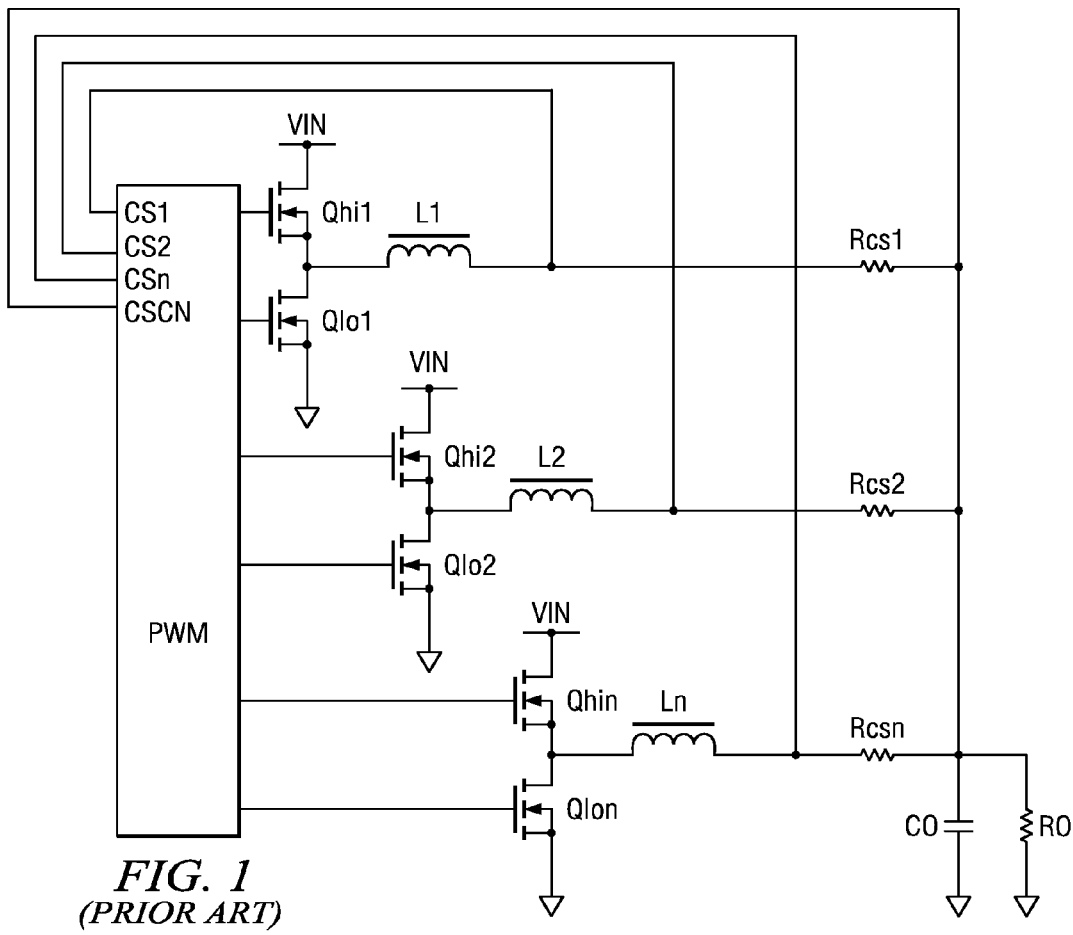
FIG. 1 illustrates a conventional converter including an integrated pulse width modulation controller, power MOSFETs and an output filter.
Figure 1A:
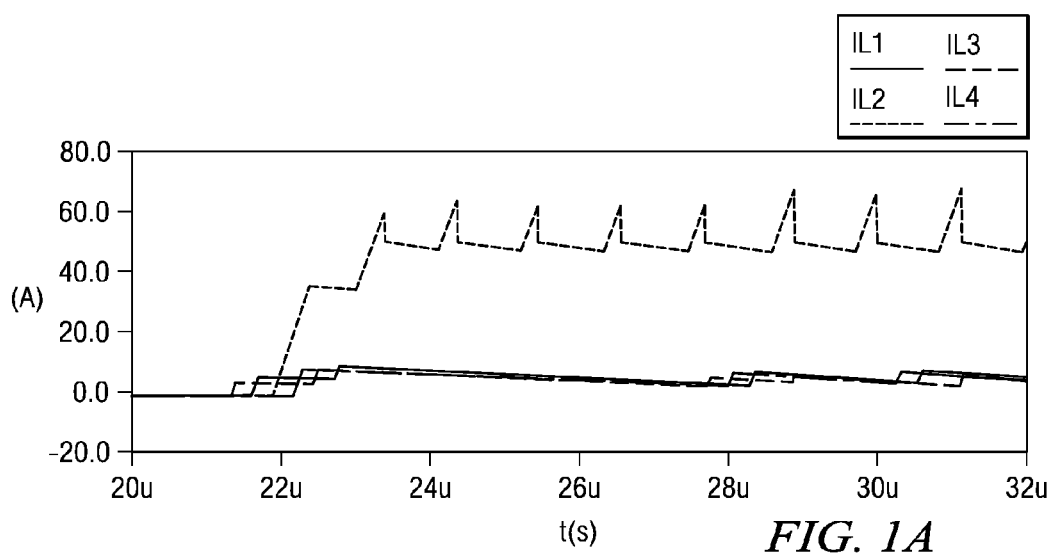
FIG. 1A illustrates an example of a behavioral pattern of a four-channel system with a failure in the second channel current sense path.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Figure 2:
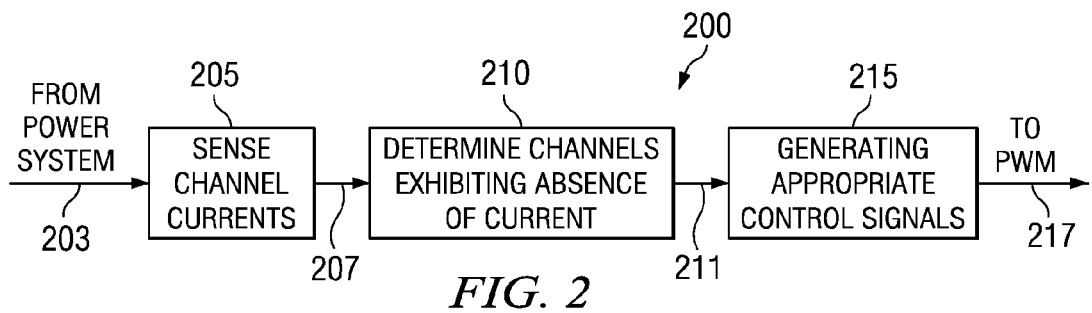
FIG. 2 illustrates a system for current sensing component failure detection according to exemplary embodiments of the present invention.

Referring to FIG. 2 there is shown a system 200 for current sensing component failure detection according to exemplary embodiments of the present invention. The system 200 includes a sensor device 205 for sensing currents for each channel and for generating signals representative of each channel current (herein referred to as channel current signal), a fault device 210 for determining whether any one of the channel current signals exhibit features which indicate failed sensor components and, thus unreliable current readings in which a dearth of current for over a time period corresponding to the switching time of the current indicates an unreliable reading from the sensor components. The fault device 210 further outputs an indicator or flag consistent with a positive determination. The system 200 further includes a control signal generator 215 for generating control signals appropriate for a determination of unreliability the fault device 210.

The sensor 205 receives channel current information from the multiphase converter (such as that illustrated in FIG. 1) at input 203 for generating a channel current signal for each phase, the channel current signal can be a voltage signal for example. The channel current signals are subsequently output to an input 207 of the fault device 210. The sensor 205 can be operatively configured using well-known conventional techniques.

Figure 3:
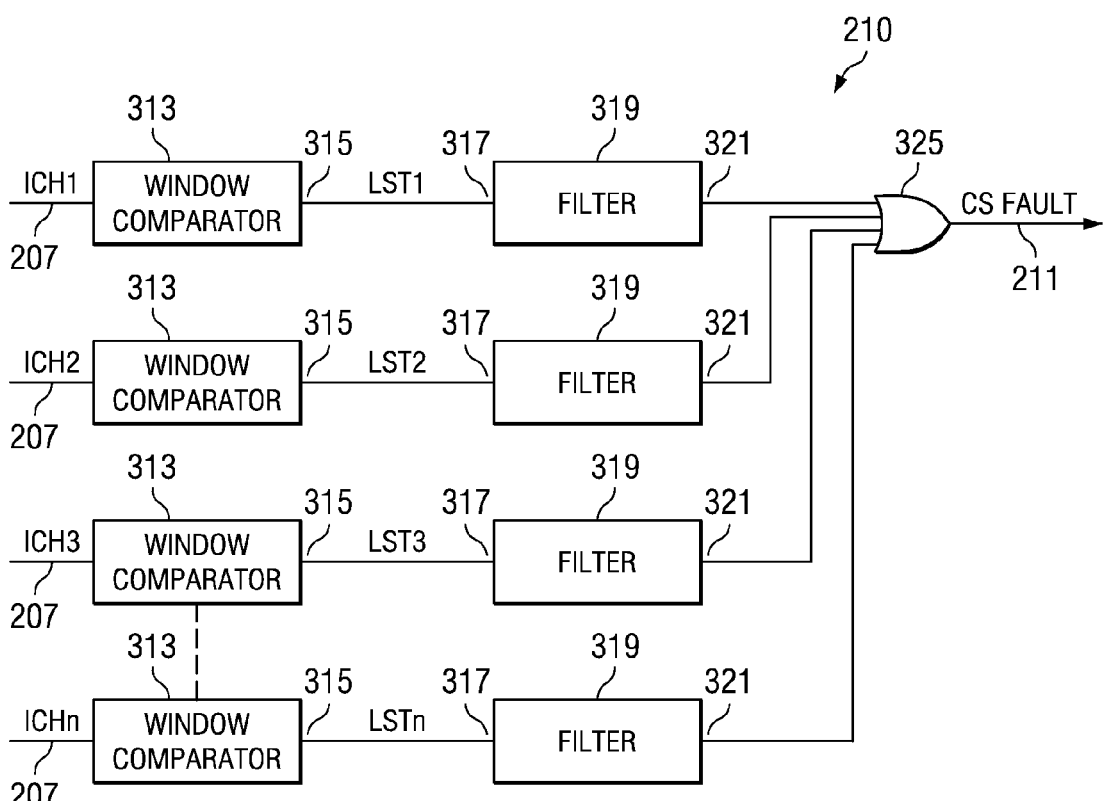
FIG. 3 illustrates a fault device in accordance with exemplary embodiments of the present invention.

Referring now to FIG. 3 there is shown a fault device 210 in accordance with exemplary embodiments of the present invention. The fault device 210 includes window comparators 313 and filters 319, and can include an OR gate 325 for multichannel indication mode. Channel current signals are received at respective inputs 207 of the comparators 313. The high and low thresholds of the comparators 313 are selected to correspond with the peak and valley of the channel switching current of the converter and are in most cases symmetrical about zero. It is expected that during normal operation the channel current signal will only temporarily cross the high threshold and low threshold, and will be mostly outside the window for any given switching period. Even for a power system at zero output current, the individual channel current will exceed these thresholds due to the ripple effect of the channel current associated with the typical switching nature of the converter, FIG. 4B.

The channel current signal is compared to the thresholds and signals representative of the results of the comparison ($LST_1$, $LST_2$, $LST_3$ ... $LST_N$) are output at 315 to an input 317 of a respective filter 319. During normal operation, signals $LST_1$, $LST_2$, $LST_3$ ... $LST_N$ will be logic 'low' (i.e., outside the window) and logic 'high' (i.e., inside the window) for a fraction of the converter switching cycle.

Each of the filters 319 include a low pass filter for filtering the received comparator signals ($LST_1$, $LST_2$, $LST_3$ ... $LST_N$). The low pass filter is configured to have a time constant which exceeds the time constant associated with switching processes in the converter. Thus, signals $LST_1$, $LST_2$, $LST_3$ ... $LS_N$ which are long enough to pass through the filter 319 are indicated as fault signals at outputs 321 received at the OR gate 325. For a fault indication on any of the channels, the OR gate 325 outputs a single fault signal at output 211 to the control signal generator 215 (FIG. 2). In a further embodiment, the individual outputs 321 can be forwarded directly to the control signal generator 215 for individual indication mode.

The control signal generator 215 generates control signals for informing the PWM of failed channel components in the sensing circuit so that the PWM may take appropriate actions (such as limiting or disabling the indicated channels, or shutting down the converter). The control signal generator 215 can be operatively configured using well-known conventional techniques.

Figure 4A:
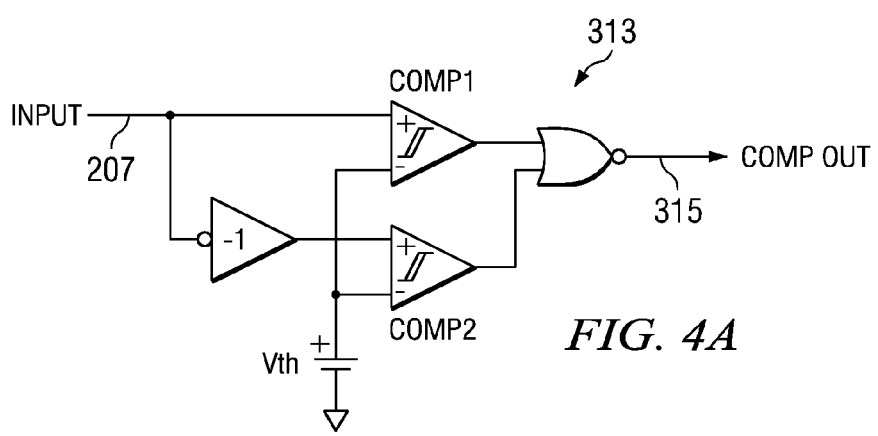
FIG. 4A illustrates a circuit for enabling a window comparator shown in FIG. 3 in accordance with exemplary embodiments of the present invention.
Figure 4B:
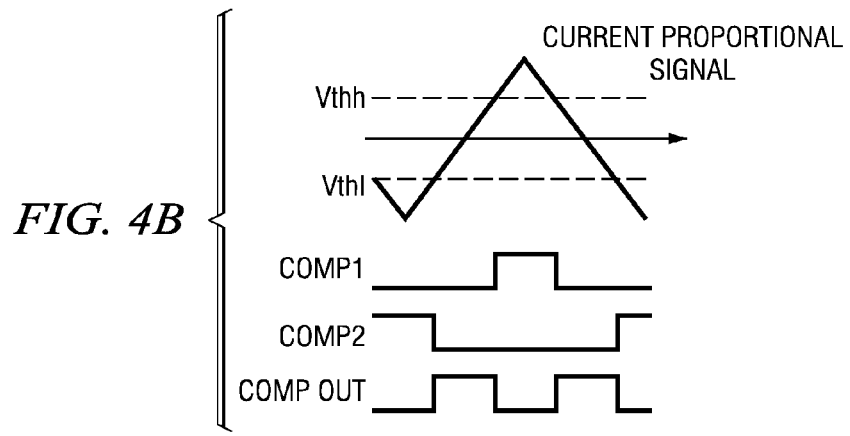
FIG. 4B illustrates an example of an input signal and corresponding comp out signal for the circuit shown in FIG. 4A.

Referring to FIG. 4A there is illustrated a circuit for enabling a window comparator 313 (FIG. 3) in accordance with exemplary embodiments of the present invention. For a channel current signal received at 'input', the circuit produces a high logic state on output 'comp out' when the channel current signal (which in this case is a voltage signal) is of a value that falls within the upper threshold $V_{thh}$ and lower threshold $V_{thl}$ (an example of an input signal and corresponding comp out signal is shown in FIG. 4B). The thresholds $V_{thh}$ and $V_{thl}$ are symmetrical and programmed in comparators comp1 and comp2 by the voltage source $V_{th}$ in which comp2 is receiving an inverted signal of the input. The $V_{th}$ voltage is selected based on the peak and valley levels of the current signal of the converter. In the case of a failure within the current sense path (which causes a false indication of zero current in conventional systems), the channel current signal will be contained within the thresholds for a time period greater than that expected during a normal switching cycle. In this example, the output of the window comparator 313 will be high for the amount of time substantially longer compared to a period of the system switching frequency.

Figure 5A:
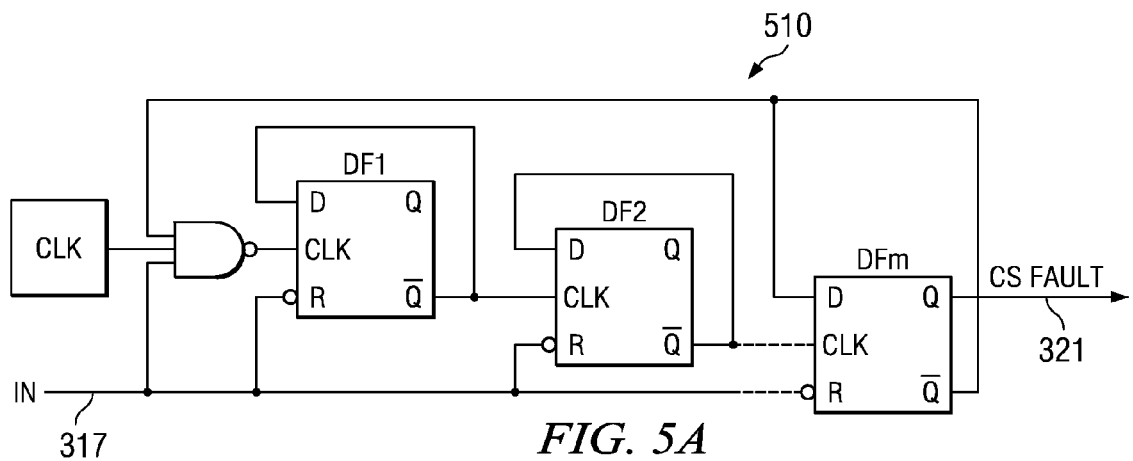
FIG. 5A illustrates a digital filter for enabling the filter shown in FIG. 3.

Referring now to FIG. 5A there is shown a digital filter 510 for enabling the filter 319 shown in FIG. 3 in accordance with exemplary embodiments of the present invention. The digital filter 510 is responsive to the 'high' logic state of the window comparator signal received on input IN and is reset by the 'low' logic state. If the input stays 'high' longer than $2^{m-1}$ clock cycles (where m is a number of flip-flops used in a counter) the filter output will also produce a 'high' logic signal.

Figure 5B:
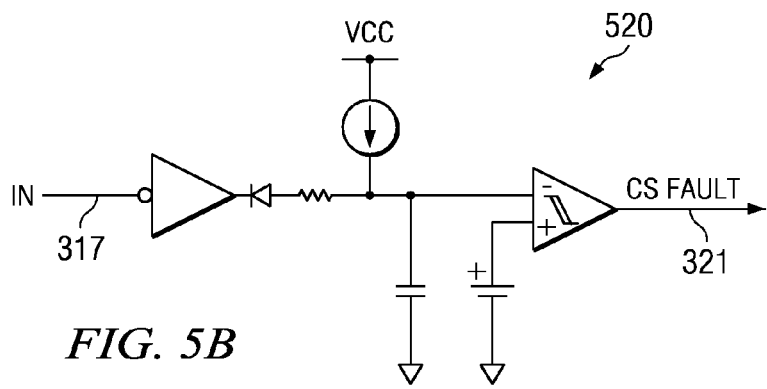
FIG. 5B illustrates an analog filter for enabling the filter shown in FIG. 3.

Referring now to FIG. 5B there is shown an analog filter 520 for enabling the filter 319 shown in FIG. 3 in accordance with exemplary embodiments of the present invention. The analog filter 520 produces a logic 'low' signal due to the current source that pulls inverting input of the comparator to Vcc. An RC time constant is programmed such that short 'high' pulses cannot bring the inverting input to the level that is lower than a threshold set by the voltage source. Only pulses that are long enough are capable to discharge the capacitor to the level that is lower than the voltage source and produce a logic 'high' signal on the analog filter output.

Although preferred embodiments of the apparatus and method of the present invention have been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. An apparatus for evaluating current sensors in a multichannel current sharing system, wherein the channel currents alternate between a peak current level and a valley current level over a switching time period, said apparatus comprising:

an input for receiving a signal indicative of a current sensed via one of said current sensors; and circuitry coupled to said input and responsive to said signal for indicating a failed sensing due to a failed sensor component for said current when a low current sensor output occurs for a time period that exceeds said switching time period.

2. The apparatus of claim 1, wherein said circuitry is on an integrated circuit chip.

3. The apparatus of claim 2, wherein said circuitry includes a window comparator coupled to said input and operable to activate a fault condition signal when said low current sensor output occurs.

4. The apparatus of claim 3 further including a filter coupled to said window comparator and operable to activate a fail signal when said fault condition signal exceeds a time constant of said filter.

5. The apparatus of claim 3 wherein said window comparator includes:
   first and second comparators configured to compare said input signal with respective first and second references, wherein said first and second references represent fault condition thresholds; and
   a logic gate coupled to said first and second comparators to receive outputs from said first and second comparators.

6. The apparatus of claim 5 further including a filter coupled to an output of said logic gate and having a time constant greater than said switching time period, said filter operable for activating a fail signal when a status output signal from said logic gate exceeds said time constant.

7. The apparatus of claim 1 further comprising:
   at least one further input for receiving a further signal indicative of a further current sensed via a further one of said sensors; and
   at least one further circuitry coupled to said further input and responsive to said further signal for indicating a failed sensing due to a failed sensor component among said further current when a low current sensor output occurs for a time period that exceeds said switching time period.

8. The apparatus of claim 7 further including an output coupled to both said circuitry and said further circuitry for providing an indicator in response to an indication of failed sensing due to a failed sensor component for any of said current and said further current.

9. The apparatus of claim 4, wherein said filter is configured to compare a duration of said fault condition to an RC time constant, to generate a pulse and to count numbers of pulses with said durations greater than said time constant.

10. A converter having channels for providing switching currents, said converter comprising:
    a sensor coupled with one of said channels and operable for sensing a current thereof and outputting a signal indicative of said current on an output; and
    an evaluator having an input for receiving said signal and responsive to said signal for indicating a failed sensing due to a failed sensor component when a low current output occurs for a time period that exceeds a switching time period of said current.

11. The converter of claim 10, wherein said sensor is in an integrated circuit chip.

12. The converter of claim 11, wherein said evaluator includes a window comparator operable to activate a fail condition signal when a fault condition occurs.

13. The converter of claim 12, wherein said evaluator further including a filter coupled to said window comparator and operable to activate a fail condition signal when said fault condition signal exceeds a time constant of said filter.

14. The converter of claim 12 wherein said window comparator includes:
   first and second comparators configured to compare said signal with respective first and second references, wherein said first and second references represent a fault condition threshold; and
   a logic gate coupled to said first and second comparators to receive outputs from said first and second comparators.

15. The converter of claim 14, wherein said evaluator further including a filter coupled to an output of said logic gate and having a time constant greater than the switching time period, said filter operable for activating a fail signal when a status output signal from said logic gate exceeds said time constant.

16. The converter of claim 10 further comprising:
   a further sensor coupled with a further one of said channels and operable for sensing a further current thereof and outputting a further signal indicative of said further current; and
   a further evaluator having an input for receiving said further signal and responsive to said further input signal for indicating a failed sensing due to a failed sensor component when a low current sensor output occurs for a time period that exceeds the switching time period.

17. A method for evaluating a current sensor in a converter, said method comprising:
   providing a signal indicative of a current sensed by said current sensor;
   verifying a failed sensing due to a failed sensor component:
   comparing said signal to predetermined thresholds for detecting a low current sensor output;
   providing a fault signal upon detecting a low condition transition;
   comparing said fault signal to a predetermined time period and providing a fail signal upon detecting said fault signal having a duration greater than said predetermined time period.

18. The method of claim 17 further including establishing high and low thresholds characterizing said predetermined thresholds from a maximum level of said current and a minimum level of said current, respectively.

19. The apparatus of claim 1, wherein said circuitry is on an integrated circuit; and said low current output is characterized by a first threshold corresponding to said peak current level and a second threshold corresponding to said valley current level.

20. The apparatus of claim 11, wherein said sensor is on an integrated circuit; and said low current output is characterized by a first threshold corresponding to a peak current level and a second threshold corresponding to a valley current level.

* * * * *